(12) United States Patent
Oka et al.

(10) Patent No.: US 8,617,688 B2
(45) Date of Patent: Dec. 31, 2013

(54) CONDUCTIVE PASTE AND MULTILAYER PRINTED WIRING BOARD USING THE SAME

(75) Inventors: Yoshio Oka, Osaka (JP); Hitoshi Takii, Osaka (JP); Noriki Hayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 571 days.

(21) Appl. No.: 11/663,450

(22) PCT Filed: May 18, 2006

(86) PCT No.: PCT/JP2006/009910
§ 371 (c)(1),
(2), (4) Date: Mar. 22, 2007

(87) PCT Pub. No.: WO2006/129487
PCT Pub. Date: Dec. 7, 2006

(65) Prior Publication Data
US 2009/0220738 A1    Sep. 3, 2009

(30) Foreign Application Priority Data

May 30, 2005   (JP) .................................. 2005-156693

(51) Int. Cl.
*B32B 3/24* (2006.01)
*H05K 3/40* (2006.01)
*H01B 1/24* (2006.01)

(52) U.S. Cl.
USPC ............ 428/139; 252/514; 174/257; 174/264

(58) Field of Classification Search
USPC .................... 428/139; 174/264, 257; 252/514
See application file for complete search history.

(56) References Cited

U.S. PATENT DOCUMENTS

| 4,827,083 A * | 5/1989 | Inasaka et al. ................. 174/264 |
| 6,515,237 B2 * | 2/2003 | Kikuchi et al. ................ 174/261 |
| 2004/0094751 A1 | 5/2004 | Ogiwara |

FOREIGN PATENT DOCUMENTS

| JP | 01-119602 | 5/1989 |
| JP | 6-338218 | 12/1994 |
| JP | 9-268301 | 10/1997 |
| JP | 2001-93330 | 4/2001 |
| JP | 2002-245849 | 8/2002 |
| JP | 2002-245852 | 8/2002 |

(Continued)

OTHER PUBLICATIONS

Ito et al., "All Polyimide Multi-layer IC Substrate", Fujikura Technical Review 107, Oct. 2004, pp. 37-41. (w/ English Abstract).

(Continued)

*Primary Examiner* — William P Watkins, III
(74) *Attorney, Agent, or Firm* — McDermott Will & Emery LLP (57) ABSTRACT

The present invention provides a conductive paste comprising flake conductive fillers having a 99% cumulative particle size of 25 μm or less and a binder resin as essential components. The flake conductive fillers are metal particles having a silver-copper alloy surface layer. The conductive paste according to the present invention is fused with a part of a copper foil circuit to which the conductive paste is to be connected during connection by heating and pressurization, and has high electrical conductivity and high fill ration in a via hole. Thus, the conductive paste according to the present invention provides a multilayer printed wiring board that has high reliability of connection and excellent interlayer connection.

6 Claims, 5 Drawing Sheets

(56) References Cited

FOREIGN PATENT DOCUMENTS

| | | |
|---|---|---|
| JP | 2003-92024 | 3/2003 |
| JP | 2003-105404 | 4/2003 |
| JP | 2003-141929 | 5/2003 |
| JP | 2004-68111 | 3/2004 |
| JP | 2006-161081 | 6/2006 |
| JP | 2006-183110 | 7/2006 |
| WO | WO 03/019998 A1 | 3/2003 |

OTHER PUBLICATIONS

Supplementary European Search Report issued in European Patent Application No. EP 06746598 dated May 15, 2009.
Japanese Notice of Reasons for Rejection, and English translation thereof, issued in Japanese Patent Application No. 2007-518904 dated Jan. 17, 2012.
Taiwanese Office Action, and English translation thereof, issued in Taiwanese Patent Application No. 095118931 dated Mar. 26, 2012.

* cited by examiner

CONDUCTIVE PASTE AND MULTILAYER PRINTED WIRING BOARD USING THE SAME

RELATED APPLICATIONS

This application is the U.S. National Phase under 35 U.S.C. §371 of International Application No. PCT/JP2006/309910, filed on May 18, 2006, which in turn claims the benefit of Japanese Application No. 2005-156693, filed on May 30, 2005, the disclosures of which Applications are incorporated by reference herein.

TECHNICAL FIELD

The present invention relates to a conductive paste that has a high electrical conductivity, that is used as filling for a via hole of a multilayer printed wiring board, and that is used to form a bump or a circuit of a multilayer printed wiring board. The present invention also relates to a multilayer printed wiring board using the conductive paste.

BACKGROUND ART

A multilayer printed wiring board is known as a technology to permit high-density packaging and the shortest connection of components. The term "connection" as used herein means electrical continuity. An interstitial via hole (IVH) technique is applied to the manufacture of a multilayer printed wiring board in which higher-density packaging is required. The IVH technique is characterized in that a via hole passing through adjacent layers is filled with a conductive material so as to connect the adjacent layers. According to the IVH technique, the interlayer connection can be formed only at a portion where the connection is required. In addition, a component can be mounted on the via hole. Hence, the IVH technique enables high density wiring allowing a high degree of flexibility.

Figure 4:
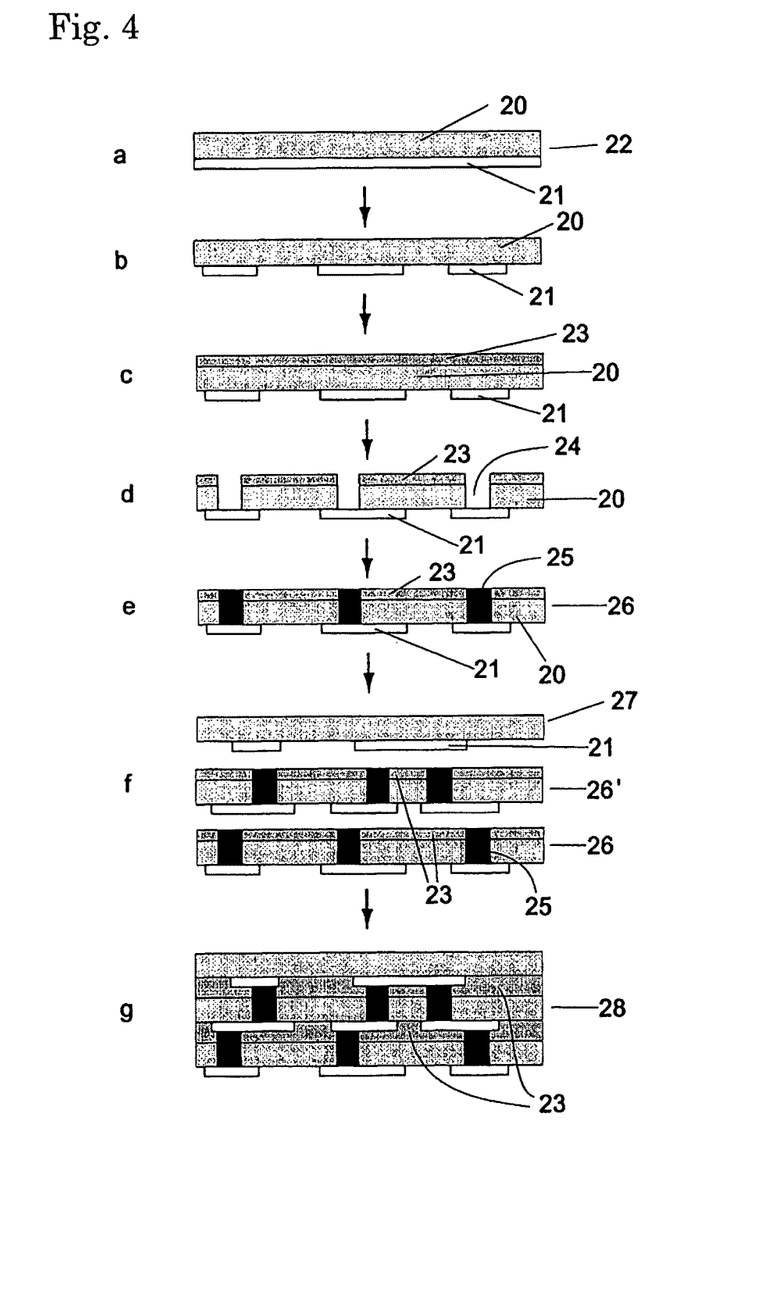
FIG. 4 is a process drawing illustrating a method for manufacturing a known multilayer printed wiring board.

For example, Fujikura Technical Review 107, pp. 37-41 (October, 2004) describes a multilayer printed wiring board manufactured by stacking single-side copper clad polyimide substrates by means of the IVH technique. FIG. 4 is a process drawing illustrating the process of manufacturing the multilayer printed wiring board.

First, a copper foil of a single-side copper clad polyimide substrate (CCL: FIG. 4a) is etched to form a circuit (FIG. 4b). After an adhesive sheet 23 is laminated on the single-side copper clad polyimide substrate (FIG. 4c), via holes are formed by a perforation process utilizing laser irradiation (FIG. 4d). After the via holes are filled with a conductive paste by screen printing, a substrate 26' that is manufactured by the same method and a single-side copper clad substrate 27 including a circuit are stacked on the adhesive sheet 23 while adjusting their positions. Their interply adhesion is performed altogether by heating under pressure so that a multilayer printed wiring board is formed.

For the purpose of filling such a via hole, a conductive paste which is made by dispersing conductive fillers such as metal powders in a resin binder is widely used. For example, Patent document 1 discloses a conductive paste composition used for filling a via hole, which composition is made of a liquid epoxy resin in which a plurality of electroconductive powders having different average particle diameters are dispersed. According to the description of Patent document 1, the fill ration of the electroconductive powders in a via hole can be increased by blending the electroconductive powders having different average particle diameters, and consequently the reliability of connection can be improved.

Patent Document 1: Japanese Unexamined Patent Application Publication No. 2003-92024.

Non-patent Document 1: Fujikura Technical Review 107, pp. 37-41 (October, 2004)

DISCLOSURE OF INVENTION

Problems to be Solved by the Invention

In the multilayer printed wiring board described above, the size of via holes must be reduced if further downsizing and greater packaging density are to be achieved. However, a reduction in the size of a via hole causes a reduction in the fill ration of a conductive paste in the via hole and thereby results in lower reliability of connection. This is because the flowability of conductive filler decreases locally since the size of conductive filler in a conductive paste becomes relatively considerable when a via hole is decreased in size. This tends to cause a void.

To solve these problems, the particle size of conductive filler may be decreased. However, in general, a smaller particle size of conductive filler tends to cause a decrease in the electrical conductivity of the conductive paste. This is because the smaller particle size of conductive filler causes an increase in contact resistance between conductive filler particles.

Non-patent document 1 proposes a method in which the connection resistance is decreased by using relatively large conductive fillers in a conductive paste so as to bite into a copper foil at the bottom of a via hole. However, to allow the conductive filler to bite into the copper foil, the percentage of a binder resin in the conductive paste must be decreased. This causes poor adhesion between the copper foil and the conductive paste. Furthermore, the conductive filler must be large enough to bite into the copper foil. A reduction in the size of a via hole therefore causes a reduction in the fill ration of a conductive paste.

The present invention solves these problems. It is an object of the present invention to provide a conductive paste which enables high reliability of connection, having a satisfactory electrical conductivity as well as a satisfactory fill ration even in a small via hole. It is another object of the present invention to provide a multilayer printed wiring board using the conductive paste.

Means for Solving the Problems

The present invention provides a conductive paste comprising flake conductive fillers having a 99% cumulative particle size of 25 μm or less and a binder resin as essential components, wherein the flake conductive fillers are metal particles each having a silver-copper alloy surface layer.

According to a first aspect of invention of the present application, the fill ration of the conductive paste can be increased even in a small via hole by using the flake conductive fillers having a 99% cumulative particle size of 25 μm or less, and the packing density of the conductive fillers in the conductive paste can be increased, and hence a conductive paste having high electrical conductivity can be obtained. When the silver-copper alloy surface layer of the flake conductive filler is heated and pressed for connection, it is fused with a part of a copper foil circuit with which the connection is to be made. Hence, a via hole connection of low connection resistance can be achieved.

A second aspect of invention of the present application is conductive paste according to the first aspect of invention of the present application, wherein the flake conductive fillers have a 99% cumulative particle size of 15 μm or less.

By using the flake conductive fillers having a 99% cumulative particle size of 15 μm or less, the fill ration of the conductive paste can be increased further even in a small via hole, and the packing density of the conductive fillers in the conductive paste can be increased, and hence a conductive paste having high electrical conductivity can be obtained. When the silver-copper alloy surface layer of the flake conductive filler is heated and pressed for connection, it is fused with a part of a copper foil circuit with which the connection is to be made. Hence, a via hole connection of further lower connection resistance can be achieved.

A third aspect of invention of the present application is a conductive paste according to the first or second aspect of invention of the present application, wherein the metal particles are silver-coated copper particles.

According to the third aspect of invention of the present application, the electrical conductivity can further be increased by using as conductive fillers the silver-coated copper particles having high electrical conductivity.

A fourth aspect of invention of the present application is a conductive paste according to any of the first to third aspects of invention in the present application, wherein the flake conductive fillers having a 99% cumulative particle size of 15 μm or less constitute 20% by weight to 80% by weight of the total conductive fillers.

By arranging the ratio of flake conductive fillers having a 99% cumulative particle size of 15 μm or less to fall in the range described above, a conductive paste which can achieve superior filling in a via hole can be prepared.

A fifth aspect of invention of the present application is a conductive paste according to the fourth aspect of invention of the present application, wherein spherical conductive fillers having a 99% cumulative particle size of 15 μm or less are further included as an essential component.

According to the fifth aspect of invention of the present application, the use of the flake fillers and the spherical fillers in combination can increase the percentage of the conductive fillers in the conductive paste and also allow the enhanced removal of air bubbles during the filling of a via hole, which enables increase of the electrical conductivity.

A sixth aspect of invention of the present application is a conductive paste according to any of the first to fifth aspects of invention in the present application, wherein the application of the conductive paste is for filling of a via hole of a multilayer printed wiring board.

A seventh aspect of invention of the present application provides a multilayer printed wiring board having interlayer connection via hole parts, in which the via holes are filled with the conductive pastes set forth in any of the first to sixth aspects of the invention in the present application. The conductive pastes according to the first to sixth aspects of the invention in the present application are superior in terms of high fill ration in a via hole and a high electrical conductivity, and can provide a multilayer printed wiring board having interlayer connection via hole parts.

An eighth aspect of invention of the present application is a multilayer printed wiring board according to the seventh aspect of invention of the present application, wherein a part of the flake fillers in the conductive paste are fused with a part of a conductive layer circuit. The fusion between a part of the flake fillers and a part of a conductive layer circuit reduces the connection resistance between the conductive paste and the conductive layer circuit, and accordingly a multilayer printed wiring board having high reliability of connection can be obtained.

Advantages of the Invention

The present invention provides a conductive paste which is superior in electrical conductivity and high fill ration in a via hole and which exhibits high reliability of connection. The present invention also provides a multilayer printed wiring board using the conductive paste.

REFERENCE NUMERALS 1 polyimide resin sheet
2, 13, 21 copper clad layer
3, 22 copper clad laminate
4 mold releasing layer
5, 24 via hole
6 conductive substance-filled parts
7 bump
20 resin film
25 conductive paste
27 copper clad laminate
26, A, A1, A2 single-sided wiring board base material
23, B, B1, B2 adhesive sheet layer
C, C' double-sided wiring board base material
15, 16, 28 multilayer printed wiring board

BEST MODE FOR CARRYING OUT THE INVENTION

The present invention is described in detail below.

A powder of metal, such as a single element metal, an alloy, or a composite metal, can preferably be used as flake conductive fillers having a 99% cumulative particle size of 25 μm or less in the present invention. Examples of the metal include platinum, gold, silver, copper, and palladium. Among these, a silver powder and a silver-coated copper powder are preferred because of their high electrical conductivities. The term "flake" as used herein refers to a particle in which the ratio L/D of the maximum length L to the thickness D is at least 3.

The flake conductive filler must have a silver-copper alloy surface layer. When an interlayer connection of substrates having via holes filled with the conductive paste are accomplished by heating under pressure, the silver-copper alloy surface layer of the flake conductive filler is fused with a part of a copper foil circuit with which the connection is to be made. For example, the conductive filler having a silver-copper alloy surface layer may be prepared by forming a silver layer on the surface of a metal particle that has a copper layer on the surface and heating the metal particle in a wet reducing atmosphere.

The flake conductive filler must have a 99% cumulative particle size of 25 µm or less. When the 99% cumulative particle size is 25 µm or less, the fill ration of a conductive paste can be increased even in a small via hole and the packing density of the conductive filler in the conductive paste can be increased. The conductive paste can therefore have a high electrical conductivity. The range of the 99% cumulative particle size is more preferably 15 µm or less and still more preferably 5 µm to 12 µm.

The term "99% cumulative particle size" as used herein refers to a particle size at a point when the cumulative values measured in a particle size distribution becomes 99%. The 99% cumulative particle size may be determined with a particle size distribution analyzer that employs a laser Doppler method [Nanotrac (trademark) particle size distribution analyzer UPA-EX150 manufactured by NIKKISO CO., LTD.].

Preferably, the flake conductive fillers have an average particle diameter in the range of 1 µm to 4 µm. By arranging the average particle diameter in such range in addition to specifying the 99% cumulative particle size, a conductive paste having higher electrical conductivity can be provided. The average particle diameter can be determined by a particle size distribution measurement as in the case of the 99% cumulative particle size, and the particle size at a point when the cumulative values become 50% is adopted as the average particle diameter.

Conductive fillers for use in a conductive paste of the present invention may be prepared by arranging the conductive fillers having a 99% cumulative particle size of 15 µm or less and any conductive fillers in combination. In this case, the percentage of the conductive fillers having a 99% cumulative particle size of 15 µm or less is preferably 20% by weight to 80% by weight, because both the fill ration of the conductive paste in a via hole and the electrical conductivity can thereby be achieved satisfactorily. If the percentage of the conductive fillers having a 99% cumulative particle size of 15 µm or less is 20% or less, a shortcoming is that the filling density in a via hole decreases. In contrast, if this percentage is 80% or more, the drawback is that it is difficult to remove air bubbles caught in the paste during filling such that the reliability decreases.

More preferably, the conductive fillers having a 99% cumulative particle size of 15 µm or less are used in combination with spherical fillers having a 99% cumulative particle size of 15 µm or less. The combined use of the flake fillers and the spherical fillers can increase the percentage of the conductive fillers in the conductive paste and thereby increase the electrical conductivity. As in the case of flake fillers, a powder of metal, such as a single element metal, an alloy, or a composite metal, can preferably be used as such spherical conductive fillers. More preferably, the spherical conductive filler has a silver-copper alloy surface layer.

The term "spherical conductive filler" as used herein includes a conductive filler having a generally spherical shape, a spherical conductive filler having an uneven surface, and a conductive filler having an elliptical cross section. The average particle diameter of the spherical conductive fillers is not limited in particular, but preferably 10 µm or less. Moreover, instead of the flake conductive fillers or the spherical conductive fillers, other conductive fillers may be added in a scope without compromising the effect of the present invention: for example, silver particles having a size of 1 nm to 100 nm may be added.

In this case, in view of high electrical conductivity, it is preferable that the ratio of the flake conductive fillers to the spherical conductive fillers be 1:4 to 4:1. When the ratio is in this range, the effect of combining these particles is more fully achieved.

Examples of the binder resin for use in the present invention include an epoxy resin, a phenolic resin, a polyester resin, a polyurethane resin, an acrylic resin, a melamine resin, a polyimide resin, and a polyamide-imide resin. In terms of the thermal resistance of a conductive paste, a thermosetting resin, particularly an epoxy resin is preferred. Examples of the epoxy resin include, but not limited to, a bisphenol-type epoxy resin having a skeleton of bisphenol A, F, S, or AD, a naphthalene-type epoxy resin, a novolak-type epoxy resin, a biphenyl-type epoxy resin, and a dicyclopentadiene-type epoxy resin. The epoxy resin may be a phenoxy resin, which is a polymeric epoxy resin.

When the epoxy resin is used as the binder resin, a curing agent is preferably added to the conductive paste to cure and cross-link the epoxy resin. Examples of the curing agent include an imidazole, a hydrazide, an amine, such as a boron trifluoride-amine complex, an amine-imide, a polyamine, a tertiary amine, or an alkyl urea, dicyandiamide, and modified materials thereof. A latent hardener is preferred in terms of storage stability.

A conductive paste according to the present invention may contain, in addition to the essential components, an additive agent, such as a hardening accelerator, a silane coupling agent, a flame retardant, a thickener, a thixotropic agent, or a leveling agent, without departing from the gist of the present invention. Furthermore, an organic solvent, such as an ester, an ether, a ketone, an ether ester, an alcohol, a hydrocarbon, or an amine, is used to dissolve the binder resin. Because a via hole is filled with the conductive paste, for example, by screen printing, a high boiling point solvent is preferred owing to its excellent printability. Specifically, carbitol acetate and butyl carbitol acetate are particularly preferred. These solvents can be used in combination. These materials are homogeneously mixed by a three roll mill or a rotary agitation defoaming machine, so that a conductive paste is prepared.

Preferably, the conductive paste according to the present invention has a viscosity ratio ($\eta_{0.5}/\eta_{2.5}$) of 0.7 to 2.0, wherein the viscosity ($\eta_{0.5}$) at 0.5 rpm and the viscosity ($\eta_{2.5}$) at 2.5 rpm are measured at 25° C. using a No. 7 rotor with an E-type rotary viscometer, respectively. When the viscosity ratio is adjusted to this range, the fill ration of the conductive paste in a via hole is increased. Hence, the resulting multilayer printed wiring board is highly reliable.

A conductive paste according to the present invention can be used as filling of a via hole of a multilayer printed wiring board. Thus, the conductive paste of the present invention enables a multilayer printed wiring board having an interlayer connection via holes filled with the conductive paste, wherein a part of flake fillers in the conductive paste are fused with a part of a conductive layer circuit. A process of manufacturing a multilayer printed wiring board using a conductive paste according to the present invention is described below. The process of manufacture is not limited to the embodiments described below and may be modified.

Figure 1:
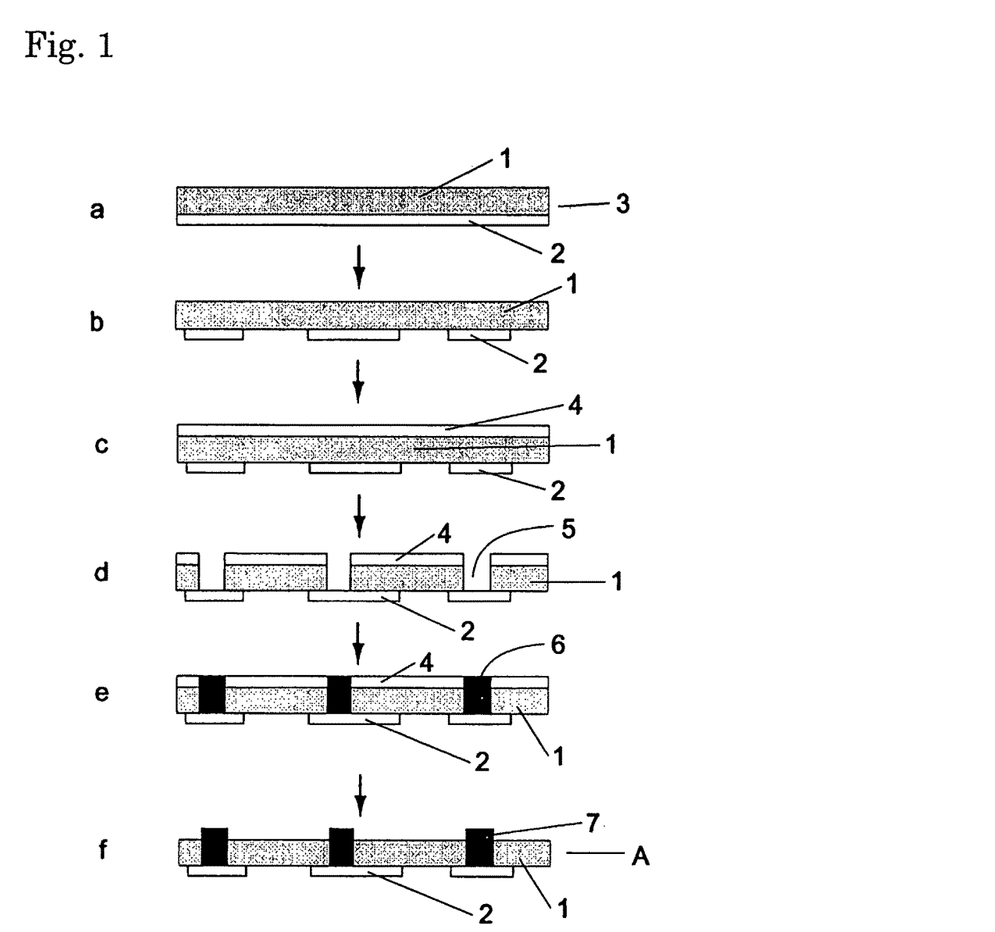
FIG. 1 is a process drawing showing one exemplary process in a manufacturing method of the present invention.

FIG. 1 is a process drawing of a process for manufacturing a single-sided wiring board base material used in the formation of a multilayer printed wiring board. A single-sided copper clad laminate 3 (CCL, FIG. 1a), which has a copper clad layer 2 disposed on one side of an insulating resin 1, such as a polyester resin or a polyimide resin, is wet-etched while the copper foil layer 2 is masked, and thereby a circuit pattern is formed on the copper foil layer 2 (FIG. 1b).

Subsequently, a mold releasing layer 4, such as a polyester resin film, is attached to the other face (which is opposite to the face where the copper clad layer 2 is provided) of the insulating resin film (FIG. 1c) Then, a mold releasing layer 4, such as a polyester resin film, is attached to the other side of the insulating resin film opposite to the copper clad layer 2 (FIG. 1c). Thereafter, by a method such as laser machining, for example, the insulating resin layer is bored to form via holes 5 (closed-end holes, blind vias) at predetermined positions (FIG. 1d).

A laser such as a UV-YAG laser may be used in the laser machining. The via holes may be formed by a method other than the laser machining. The via holes have a diameter of about 30 µm to 200 µm.

Then, the insides of the via holes 5 are cleaned by de-smearing so that the smears, such as a resin or an oxide of the copper foil, generated by the boring and remaining in the via holes 5 may be removed. Subsequently, by using a squeegee used in screen printing and squeezing the conductive paste from the top side of the mold releasing layer 4, the via holes 5 are filled with the conductive paste. Thus, the conductive substance-filled parts 6 are formed (FIG. 1e). Then, the mold releasing layer 4 is removed to form conductive substance bumps 7 having projections (FIG. 1f). Thus, a single-sided wiring board base material A is prepared. Alternatively, without attaching the mold releasing layer 4 as described above, bumps 7 may be formed by filling the via holes 5 with the conductive paste, and subsequently performing drying, bump-printing, and drying.

Figure 2:
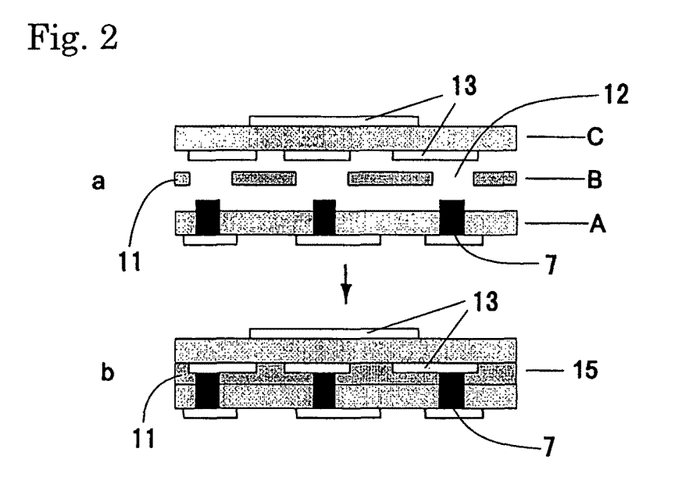
FIG. 2 is a process drawing showing one exemplary process in a manufacturing method of the present invention.

FIG. 2 is a process drawing of a process for manufacturing a multilayer printed wiring board according to the present invention, wherein the single-sided wiring board base material A prepared as described above is stacked together with an adhesive sheet layer B and a double-sided wiring board base material C. First, the bumps 7 (via holes) of the single-sided wiring board base material A, through-holes 12 of the adhesive sheet layer B, and copper foil layers 13 (copper lands) of the double-sided wiring board base material C, on which circuits are formed, are positioned at their respective positions and stacked while positioning pins are inserted in positioning holes so that the bumps 7, the through-holes 12, and the copper foil layers 13 are aligned. Then, the single-sided wiring board base material A, the adhesive sheet layer B, and the double-sided wiring board base material C are temporarily attached to each other at a temperature at which the adhesive is not completely cured (FIG. 2a). The positioning holes (not shown) are bored by laser machining, for example, in the single-sided wiring board base material A, the adhesive sheet layer B, and the double-sided wiring board base material C before stacking them.

Subsequently, the single-sided wiring board base material A, the adhesive sheet layer B, and the double-sided wiring board base material C are heated at 160° C. to 260° C. and pressed at 5 to 40 kg/cm² with a vacuum pressing machine or an equivalent machine. Because the through-holes 12 in the adhesive sheet layer B are larger than the bumps 7 (via holes) in terms of diameter, an adhesive sheet 11 and the bumps 7 are not in contact with each other at the initial stage of pressing. By heating, however, the adhesive sheet 11 and the conductive substance, which forms the bumps 7, are caused to flow and come into contact with each other. Thus, a multilayer printed wiring board 15 according to the present invention is prepared (FIG. 2b). After heating, the multilayer printed wiring board 15 is continuously pressed while it is cooled, and hence no significant warp or the like is caused.

During the process of heating and pressing, the conductive paste in the via holes is compressed, and accordingly the silver-copper alloy layer disposed on the surface of each flake conductive filler in the conductive paste is fused with the copper foil layer 2 located at the bottom parts of the via holes and a part of the copper foil layers 13 of a double-sided wiring board base material C. This strengthens the adhesion between the copper foil layer and the conductive paste. Hence, a reliable via hole connection having a low connection resistance can be achieved.

Figure 3:
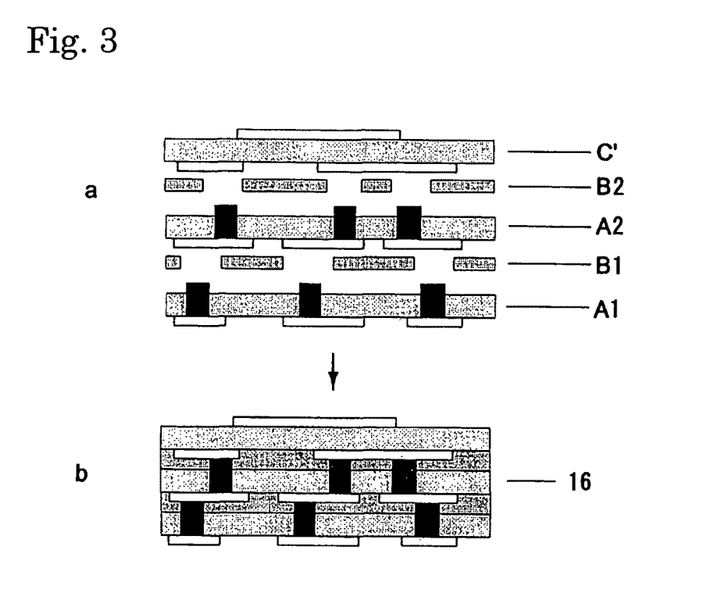
FIG. 3 is a process drawing showing one exemplary process in a manufacturing method of the present invention.

FIG. 2 shows an example in which a multilayer printed wiring board of the present invention is formed by laminating one layer of single-sided wiring board base material with another wiring board base material through an adhesive sheet layer. The method of manufacturing a multilayer printed wiring board according to the present invention can also be applied to the case in which a multilayer printed wiring board is formed using two or more single-sided wiring board base materials. FIGS. 3, 4 is a process drawing of a process for manufacturing a multilayer printed wiring board according to the present invention, wherein two layers of single-sided wiring board base materials are used.

Single-sided wiring board base materials A1 and A2 manufactured in the same way as the single-sided wiring board base material A, adhesive sheet layers B1 and B2 manufactured in the same way as the adhesive sheet layer B, and a double-sided wiring board base material C' manufactured in the same way as the double-sided wiring board base material C are stacked as illustrated in FIG. 3a, and are subsequently heated and pressed with a vacuum pressing machine or an equivalent machine as described in FIG. 2, and thereby a multilayer printed wiring board 16 of the present invention is formed as in the case illustrated in FIG. 3b.

EXAMPLES

The present invention is described with reference to examples and comparative examples as follows. The scope of the present invention is not limited to these examples.
(Preparation of Conductive Paste)

Example 1

A conductive paste was prepared as follows: 50 parts by weight of bisphenol A-type resin having a molecular weight of 55000 [EPIKOTE (Trademark) 1256 manufactured by Japan Epoxy Resin Co., Ltd.] were dissolved in 75 parts by weight of butyl carbitol acetate; lake silver-coated copper fillers, which have a 99% cumulative particle size of 5.5 µm, an average particle diameter of 1.7 µm, and a silver-copper alloy surface layer, were added as conductive fillers to 50 parts by weight of rubber (NBR)-modified epoxy resin having a weight per epoxy equivalent of 380 g/eq [ADEKA CORPORATION, EPR4030] such that the percentage of the conductive fillers in the solid contents of a conductive paste might be 55% by volume; furthermore, butyl carbitol acetate was added as a solvent; the resultant mixture was kneaded with a three roll mill; and furthermore, 17 parts by weight of imidazole latent hardener [Novacure (Trademark) HX-3941HP manufactured by Asahi Kasei Chemical Corporation] was mixed with the mixture so as to make the conductive paste.

Example 2

A conductive paste was prepared in the same way as Example 1, except that the rubber-modified epoxy resin was replaced with 50 parts by weight of bisphenol F-type epoxy resin having a weight per epoxy equivalent of 160 to 170 g/eq [EPIKOTE (Trademark) 806 manufactured by Japan Epoxy Resin Co., Ltd.].

Example 3

A conductive paste was prepared in the same way as Example 1, except that the rubber-modified epoxy resin was replaced with 50 parts by weight of bifunctional naphthalene-type epoxy resin having a weight per epoxy equivalent of 152 g/eq [Dainippon Ink and Chemicals, Incorporated, HP4032].

Example 4

A conductive paste was prepared in the same way as Example 2, except that flake silver-coated copper fillers which have a 99% cumulative particle size of 13 μm, an average particle diameter of 4.4 μm, and a silver-copper alloy surface layer were used as conductive fillers.

Example 5

A conductive paste was prepared in the same way as Example 2 except that flake silver-coated copper fillers having a 99% cumulative particle size of 3.6 μm, an average particle diameter of 1.4 μm, and a silver-copper alloy surface layer were used as conductive fillers.

Example 6

A conductive paste was prepared in the same way as Example 2 except that flake silver-coated copper fillers having a 99% cumulative particle size of 1.0 μm, an average particle diameter of 0.4 μm, and a silver-copper alloy surface layer were used as conductive fillers.

Example 7

A conductive paste was prepared in the same way as Example 2 except that 50 parts by weight of flake silver-coated copper fillers having a 99% cumulative particle size of 4.6 μm, an average particle diameter of 1.7 μm, and a silver-copper alloy surface layer and 50 parts by weight of flake silver fillers having a 99% cumulative particle size of 18 μm and an average particle diameter of 2.9 μm were used as conductive fillers.

Example 8

A conductive paste was prepared in the same way as Example 2 except that 30 parts by weight of flake silver-coated copper fillers having a 99% cumulative particle size of 5.5 μm, an average particle diameter of 1.7 μm, and a silver-copper alloy layer of on the surface and 70 parts by weight of spherical silver fillers having a 99% cumulative particle size of 10 μm and an average particle diameter of 7.8 μm were used as conductive fillers.

Example 9

A conductive paste was prepared in the same way as Example 2 except that 70 parts by weight of flake silver-coated copper fillers having a 99% cumulative particle size of 4.6 μm, an average particle diameter of 1.7 μm, and a silver-copper alloy surface layer and 30 parts by weight of spherical silver fillers having a 99% cumulative particle size of 10 μm and an average particle diameter of 7.8 μm were used as conductive fillers.

Example 10

A conductive paste was prepared in the same way as Example 2 except that flake silver-coated copper fillers having a 99% cumulative particle size of 19 μm, an average particle diameter of 5.5 μm, and a silver-copper alloy surface layer were used as conductive fillers.

Comparative Example 1

A conductive paste was prepared in the same way as Example 1 except that flake silver fillers having a 99% cumulative particle size of 18 μm and an average particle diameter of 2.9 μm were used as conductive fillers.

Comparative Example 2

A conductive paste was prepared in the same way as Example 1 except that flake silver fillers having a 99% cumulative particle size of 6.0 μm and an average particle diameter of 1.5 μm were used as conductive fillers.

Comparative Example 3

A conductive paste was prepared in the same way as Example 1 except that flake silver-coated copper fillers having a 99% cumulative particle size of 35 μm, an average particle diameter of 12 μm, and a silver-copper alloy surface layer were used as conductive fillers.

(Viscosity Measurement)

The viscosities of the conductive pastes prepared in Examples 1 to 9 and Comparative Example 1 were measured at the numbers of revolutions of 0.5 rpm and 2.5 rpm. The viscosities were measured with an E-type rotary viscometer (TV-20 viscometer, a corn-plate type (TVE-20H) manufactured by Toki Sangyo Co., Ltd. using a No. 7 rotor at normal temperature (25° C.).

(Manufacture of Interlayer-Connected Substrate)

A polyimide side of a single-sided copper clad laminate (thickness of polyimide: 25 μm, thickness of copper foil: 18 μm) on which a circuit was formed by etching was irradiated with a UV-YAG laser, and thereby eight via holes having a top diameter of 85 μm were formed. The via holes were cleaned by a wet desmear process. Subsequently, the via holes were filled with a conductive paste by screen printing, and then, another kind of conductive paste having a different viscosity was printed (bump printing) on the via holes so as to form conductive bumps.

Then, an epoxy resin adhesive sheet having a thickness of 25 μm and having through-holes formed at the positions corresponding to the via holes and a double-sided wiring board (thickness of polyimide: 25 μm, thickness of copper foil: 12 μm) including a circuit were stacked and bonded by a vacuum press, and thereby a multilayer printed wiring board having the eight via holes connected together in a daisy-chain structure was formed. The vacuum press was performed at a temperature of 200° C. and a pressure of 1.3 MPa.

(Evaluation of Connection Resistance)

The connection resistance of the resulting multilayer printed wiring board was measured. The connection resistance was measured at both sides of the daisy-chain by a four-terminal method. The connection resistance was considered to be the total of the resistance of the conductive paste filled in the eight via holes, the resistance of a conductive layer (circuit), and the contact resistance between the conductive paste and the conductive layer.

(Reliability Evaluation)

After the multilayer printed wiring board was passed through a reflow furnace at a peak temperature of 260° C. six times, the connection resistance of the multilayer printed wiring board was measured in order to determine the rate of increase in the resistance. Table 1 illustrates the results.

TABLE 1

| | Viscosity (Pa·s) | | | Connection resistance (Ω) | | |
|---|---|---|---|---|---|---|
| | 0.5 rpm | 2.5 rpm | Void | initial | after reflow | increase rate |
| Example 1 | 21 | 21 | ○ | 0.2105 | 0.2111 | 0% |
| Example 2 | 20 | 21 | ○ | 0.2157 | 0.2162 | 0% |
| Example 3 | 22 | 22 | ○ | 0.2202 | 0.2209 | 0% |
| Example 4 | 21 | 20 | ○ | 0.2170 | 0.2178 | 0% |
| Example 5 | 35 | 20 | ○ | 0.2207 | 0.2229 | 1% |
| Example 6 | 33 | 19 | ○ | 0.2193 | 0.2219 | 1% |
| Example 7 | 30 | 21 | ○ | 0.2217 | 0.2267 | 2% |
| Example 8 | 19 | 21 | ○ | 0.2219 | 0.2225 | 0% |
| Example 9 | 21 | 20 | ○ | 0.2123 | 0.2130 | 0% |
| Example 10 | 36 | 21 | ○ | 0.2188 | 0.2254 | 3% |
| Comparative Example 1 | 51 | 23 | ○ | 0.2235 | 0.2371 | 8% |
| Comparative Example 2 | 33 | 2.0 | ○ | 0.2209 | 0.2761 | 25% |
| Comparative Example 3 | 34 | 22 | × | 0.2240 | 0.3104 | 14% |

As is shown in Table 1, use of the conductive pastes according to Examples 1 to 9, in which flake conductive silver-coated copper fillers having a 99% cumulative particle size of 15 μm or less and having a silver-copper alloy surface layer are contained enables a reliable multilayer printed wiring board having a low connection resistance and a low increase rate of the resistance after reflow. By contrast, use of the conductive paste according to Comparative Example 1 containing conductive fillers having a 99% cumulative particle size of 18 μm resulted in low reliability, exhibiting an increased connection resistance after reflow. Observation of the via holes after curing showed that the conductive pastes according to Examples 1 to 9 were fully filled in the via holes without generating any void, while the conductive paste according to Comparative Example 1 generated voids. This seemed to have caused the conductive paste of Comparative Example 1 to have an insufficient fill ration in the via holes, resulting in an increase of resistance after the reflow test.

(Cross-Sectional Evaluation)

Figure 5:
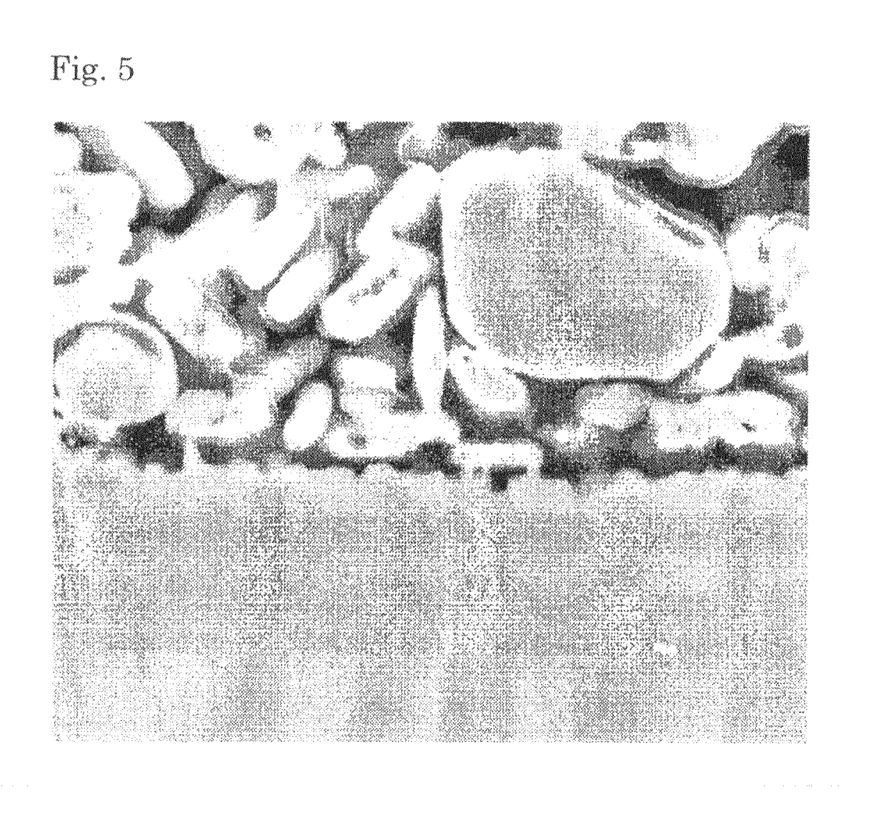
FIG. 5 is a cross-sectional view of a via part prepared with a conductive paste according to Example 2.
Figure 6:
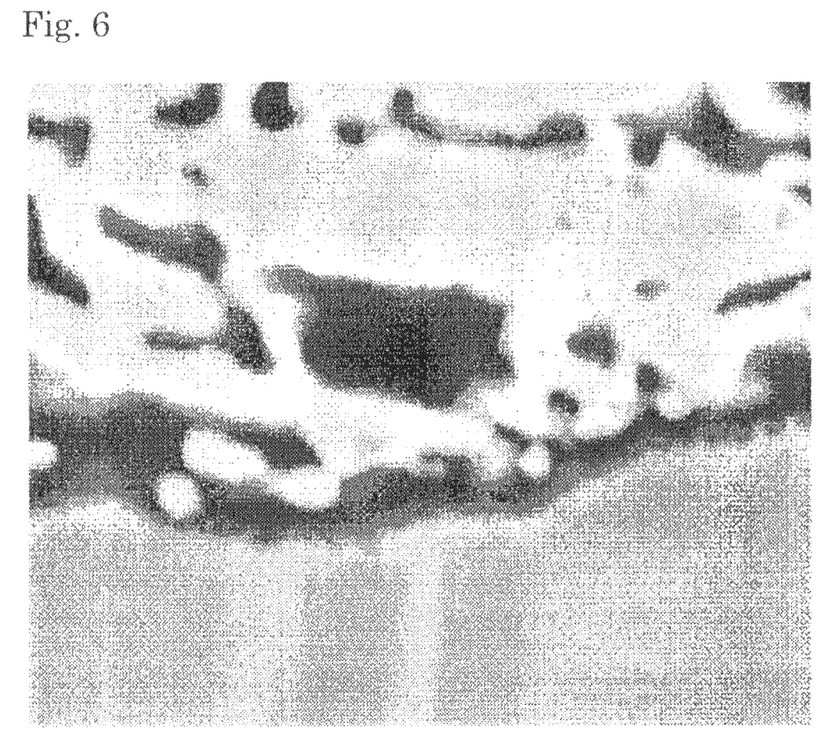
FIG. 6 is a cross-sectional view of a via part prepared with a conductive paste according to Comparative Example 1.

FIGS. 5 and 6 are cross-sectional photographs of via holes formed in Example 2 and Comparative Example 1. FIG. 5 shows that according to the present invention, a part of flake fillers in the conductive paste were fused with a part of the conductive layer circuit.

INDUSTRIAL APPLICABILITY

A conductive paste according to the present invention has a high electrical conductivity and is suitably used as filling of a via hole of a multilayer printed wiring board. A conductive paste according to the present invention can also be used to form a bump or a circuit.

The invention claimed is:

1. A multilayer printed wiring board having interlayer connection via hole parts and a conductive layer circuit,
    wherein the via holes are filled with a conductive paste comprising flake conductive fillers having a 99% cumulative particle size of 25 μm or less and a binder resin as essential components, the flake conductive fillers being metal particles having a silver-copper alloy surface layer,
    wherein the conductive paste has a viscosity ratio ($\eta_{0.5}/\eta_{2.5}$) of 0.7 to 2.0,
    the flake conductive fillers have an average particle diameter in the range of 1 μm to 4 μm, and
    a part of the flake fillers in the conductive paste are fused with a part of the conductive layer circuit.

2. The multilayer printed wiring board according to claim 1, wherein the flake conductive filler has a 99% cumulative particle size of 15 μm or less.

3. The multilayer printed wiring board paste according to claim 1, wherein the metal particles are silver-coated copper particles.

4. The multilayer printed wiring board according to claim 1, wherein the flake conductive fillers constitute 20% by weight to 80% by weight of the total amount of the conductive fillers.

5. The multilayer printed wiring board according to claim 4, wherein spherical conductive fillers having a 99% cumulative particle size of 15 μm or less are further included as an essential component.

6. The multilayer printed wiring board according to claim 1, wherein spherical conductive fillers having a 99% cumulative particle size of 15 μm or less are further included as an essential component.

* * * * *

UNITED STATES PATENT AND TRADEMARK OFFICE
CERTIFICATE OF CORRECTION

PATENT NO. : 8,617,688 B2  
APPLICATION NO. : 11/663450  
DATED : December 31, 2013  
INVENTOR(S) : Yoshio Oka et al.

Page 1 of 1

It is certified that error appears in the above-identified patent and that said Letters Patent is hereby corrected as shown below:

On the Title Page, Item (86) should read:

(86) PCT No.: PCT/JP2006/309910

Signed and Sealed this
Thirteenth Day of May, 2014

Michelle K. Lee
*Deputy Director of the United States Patent and Trademark Office*